US008871607B2

(12) United States Patent
Signamarcheix et al.

(10) Patent No.: US 8,871,607 B2
(45) Date of Patent: Oct. 28, 2014

(54) METHOD FOR PRODUCING HYBRID COMPONENTS

(75) Inventors: Thomas Signamarcheix, La Terrasse (FR); Franck Fournel, Villard-Bonnot (FR); Hubert Moriceau, Saint Egreve (FR)

(73) Assignees: S.O.I. TEC Silicon on Insulator Technologies, Bernin (FR); Commissariat a l'Energie Atomique, Paris (FR)

( * ) Notice: Subject to any disclaimer, the term of this patent is extended or adjusted under 35 U.S.C. 154(b) by 728 days.

(21) Appl. No.: 12/663,096

(22) PCT Filed: Jun. 6, 2008

(86) PCT No.: PCT/EP2008/057110
§ 371 (c)(1),
(2), (4) Date: Dec. 4, 2009

(87) PCT Pub. No.: WO2008/148882
PCT Pub. Date: Dec. 11, 2008

(65) Prior Publication Data
US 2011/0163410 A1 Jul. 7, 2011

(30) Foreign Application Priority Data
Jun. 6, 2007 (FR) ...................................... 07 55531

(51) Int. Cl.
H01L 21/30 (2006.01)
H01L 21/8238 (2006.01)
H01L 21/762 (2006.01)
H01L 21/8258 (2006.01)
H01L 21/84 (2006.01)

(52) U.S. Cl.
CPC .... *H01L 21/8258* (2013.01); *H01L 21/823807* (2013.01); *H01L 21/76254* (2013.01); *H01L 21/823878* (2013.01); *H01L 21/84* (2013.01)
USPC ............ 438/455; 438/456; 438/458; 438/459

(58) Field of Classification Search
CPC .................... H01L 21/7624; H01L 21/02609; H01L 21/76254; H01L 21/84
USPC .................................. 438/455, 456, 458, 459
See application file for complete search history.

(56) References Cited

U.S. PATENT DOCUMENTS

| 4,956,313 A | 9/1990 | Cote et al. |
| 6,815,278 B1 | 11/2004 | Ieong et al. |

(Continued)

FOREIGN PATENT DOCUMENTS

| EP | 1 923 912 A1 | 5/2008 |
| JP | 6-163677 | 6/1994 |
| JP | 2008-109105 | 5/2008 |

OTHER PUBLICATIONS

Min Yang, et al., "Hybrid-Orientation Technology (HOT): Opportunities and Challenges", IEEE Transactions on Electron Devices, vol. 53, No. 5, May 2006, pp. 965-978.

(Continued)

*Primary Examiner* — David Vu
*Assistant Examiner* — Brandon Fox
(74) *Attorney, Agent, or Firm* — Oblon, Spivak, McClelland, Maier & Neustadt, L.L.P.

(57) ABSTRACT

A method for producing a hybrid substrate, including a support substrate, a continuous buried insulator layer and, on this continuous layer, a hybrid layer including alternating zones of a first material and at least one second material, wherein these two materials are different by their nature and/or their crystallographic characteristics. The method forms a hybrid layer, including alternating zones of first and second materials, on a homogeneous substrate, assembles this hybrid layer, the continuous insulator layer and the support substrate, and eliminates a part at least of the homogeneous substrate, before or after the assembling.

27 Claims, 12 Drawing Sheets

(56) References Cited

U.S. PATENT DOCUMENTS

| | | | |
|---|---|---|---|
| 7,638,842 B2* | 12/2009 | Currie et al. | 257/347 |
| 7,947,564 B2 | 5/2011 | Kostrzewa et al. | |
| 2004/0173851 A1 | 9/2004 | Ushiku | |
| 2005/0106837 A1 | 5/2005 | Nakai et al. | |
| 2005/0116290 A1* | 6/2005 | de Souza et al. | 257/347 |
| 2006/0003554 A1 | 1/2006 | Zhu et al. | |
| 2006/0024931 A1 | 2/2006 | Chan et al. | |
| 2006/0157706 A1* | 7/2006 | Zhu et al. | 257/66 |
| 2006/0172505 A1 | 8/2006 | Koester et al. | |
| 2006/0284251 A1* | 12/2006 | Hsu et al. | 257/347 |
| 2007/0122634 A1 | 5/2007 | Lee et al. | |
| 2008/0079123 A1 | 4/2008 | Kostrzewa et al. | |

OTHER PUBLICATIONS

M. Yang, et al., "Silicon-on-Insulator MOSFETs with Hybrid Crystal Orientations", Symposium on VLSI Technology Digest of Technical Papers, 2006, 2 pages.

A.J. Auberton-Hervé, "Why Can Smart Cut® Change the Future of Microelectronics?", International Journal of High Speed Electronics and Systems, vol. 10, No. 1, 2000, pp. 131-146.

M. Yang, et al., "On the Integration of CMOS with Hybrid Crystal Orientations", Symposium on VLSI Technology Digest of Technical Papers, 2004, pp. 160-161.

M. Yang, et al., "High Performance CMOS Fabricated on Hybrid Substrate with Different Crystal Orientations", IEEE 2003—IEDM 03-453, 2003, pp. 18.7.1-18.7.4.

Office Action issued Jun. 25, 2013 in Japanese Application No. 2010-510822 (With English Translation).

Office Action issued Jul. 29, 2014 in Korean Patent Application No. 10-2010-7000163, with English translation.

* cited by examiner

METHOD FOR PRODUCING HYBRID COMPONENTS

TECHNICAL FIELD AND PRIOR ART

The invention concerns structures known as "hybrid" structures, for example of semi-conductor type.

Structures of this type, in the case of layers of silicon of different crystalline orientation, are described in the article of M. Yang et al. "Hybrid-Orientation Technology (HOT): Opportunities and Challenges", IEEE Transactions on Electron devices, Vol. 53, 5, May 2006.

A method, described in M. Yang et al. "Silicon on Insulator MOSFETs with hybrid crystal orientations", 2006 Symposium on VLSI Technology Digest of Technical Papers, makes it possible to laterally extend the epitaxy zone that serves to generate the mixed zones of different crystalline orientation.

However this technique does not enable a continuous buried electrical insulator or continuous layer underneath the hybrid zones to be obtained. Such a layer or such an electrical insulator would make it possible to minimise the effects of parasitic conduction between the hybrid film and the carrier substrate, moreover enabling these devices to attain total depletion regimes in the case of electronic devices.

This therefore poses a problem, which is to produce a hybrid film with the continuous presence of a buried electrical insulator.

Another problem, which is posed this time in the specific case of germanium, is to be able to produce a substrate having, on its surface, a hybrid Ge/GaAs film or more generally Ge/heterogeneous type material (AlGaAs, InGaAs, InP, etc.), also with a continuous buried electrical insulator layer.

Germanium is indeed envisaged to replace silicon for microelectronics systems, particularly to increase the mobility of carriers within the conduction channels of transistors. Germanium thus enables hole and electron mobilities very considerably greater than mobilities of holes and electrons in Si to be proposed, but other materials such as GaAs enable an even greater improvement for the mobility of the electrons. Also, the question of a Ge/GaAs co-integration has a high potential both for the production of hybrid electronic devices (p-MOS on Ge and n-MOS on GaAs) as well as for producing electronic devices on Ge and optical emitters/receivers on GaAs to assure photon-electron conversion.

DESCRIPTION OF THE INVENTION

The invention firstly concerns a method for producing a hybrid substrate with the continuous presence of a buried dielectric.

According to the invention, a hybrid film is formed on a continuous buried insulator by the transfer, on a second substrate, of such a hybrid film initially formed on, or in, a first initial, homogeneous substrate.

The final hybrid film may be obtained according to various approaches, with or without buffer substrate or handle substrate or intermediate grip, which makes it possible to determine firstly the nature of the "deep" interface, in other words the nature of the surface of the hybrid film that will be in contact with the second substrate, or with a dielectric intermediate layer with, or formed on, this second substrate, and, secondly, the nature of the free surface of this hybrid film.

The invention concerns firstly a method for producing a hybrid substrate comprising a support substrate, a continuous layer of a buried dielectric; and, on this layer, a hybrid film comprising alternating zones of a first material and at least one second material, these two materials being different for example by their nature, their composition or even their crystallographic characteristics, said method comprising:
  the formation of a hybrid layer, comprising alternating zones of first and at least one second material on or in a homogeneous substrate,
  the assembly of this hybrid layer, the continuous layer of dielectric and the support substrate,
  the elimination of a part at least of the homogeneous substrate, before or after the assembly step.

Whether an epitaxial growth or an amorphisation, then a recrystallisation (for example by a thermal treatment), is carried out, the homogeneous substrate comprises, under its surface (therefore within its volume) a material suited to receiving the second material.

The assembly of the hybrid layer with the final substrate is for example assured by techniques of bonding by molecular adhesion. This hybrid layer, or its surface, may therefore be prepared in order to be made suited to and compatible with the specificities of such a bonding.

A part of the hybrid layer may be eliminated. The elimination of all or part of the initial substrate and, if appropriate, a part of the hybrid layer, may be obtained by fracture alone or associated with other treatments such as for example a mechanical thinning (polishing and/or grinding, etc.), and/or a chemical attack by humid or dry route, etc.

The fracture may be made along a fracture plane created by an implantation of ions or of atoms.

According to one alternative, the elimination of a part of the substrate and, if necessary, a part of the hybrid layer, may be obtained by grinding, respectively of the substrate and/or the hybrid zone. A chemical action may also make it possible to eliminate a part of the substrate, or instead a thermal action or even plasma type thinning treatments.

At least one of the second materials, in the hybrid layer, may be obtained by epitaxial growth from a third material thanks to the cavities formed up to this third material situated below the first material. This third material is different from the first material by its nature, and/or its composition, and/or its crystallographic characteristics. It may for instance be, or not, different from the second material and capable of receiving said second material, for example by epitaxy. According to one embodiment of the invention, one or several etchings (for example: trenches or cavities or caissons) are firstly carried out then an epitaxy, and the whole is then treated, for example by a "Smart Cut™" type technology or substrate fracture. A deposition of amorphous material within the cavities then a recrystallisation, also by thermal treatment, can also be used.

According to yet another approach, the second material may be formed via a local amorphisation technique then recrystallisation, for example by thermal treatment. In this case, the formation of cavities in the first material is not necessary.

The assembly of the hybrid layer with the final support substrate may comprise one or several intermediate step(s) of transferring the hybrid layer, for example on a buffer substrate.

The combined use of a buffer substrate and various possibilities for eliminating all or part of the substrate and/or the hybrid layer, enables a hybrid layer with surface properties that vary as a function of the targeted application to be produced. Among the thinning techniques that could be used, there is Smart Cut™ technology, and/or mechanical thinning (lapping, polishing, grinding etc.) and/or even the "lift off" technique and/or a thermal treatment and/or a chemical treatment and/or a plasma treatment.

The elimination of a part at least of the initial substrate, and if necessary a part of the hybrid layer, then takes place when this is assembled with the buffer substrate. In this case, the assembly with the buffer substrate may be carried out with any layer bonding technique, for example by bonding by molecular adhesion.

According to one even more specific embodiment, the homogeneous substrate, and a first part of the hybrid layer are eliminated, when this is assembled with the buffer substrate, leaving a second part of the hybrid layer remaining.

Such a method may comprise, moreover, a second thinning, of the second part of the hybrid layer assembled with the buffer substrate. According to one specific embodiment, a fraction of the second part of the hybrid layer is therefore eliminated when this second part is assembled with the buffer substrate.

The thinning of said portion of the hybrid layer may be carried out by fracture along a second fracture plane created by a second implantation of ions or of atoms.

According to one embodiment, the first and second materials have crystalline orientations of different directions. They may both be semi-conductors, for example both in silicon.

According to yet another example, the materials contained in the etched zones (trenches, cavities, caissons) are not all identical. There can be at least two such zones containing materials of different natures.

According to yet another example, the first material is germanium and the second material is gallium arsenide.

According to yet another example, the hybrid layer comprises alternating zones of a first semi-conductor material and a plurality of second semi-conductor materials. This plurality of second semi-conductor materials may moreover comprise a plurality of layers of semi-conductor materials.

Each layer of the plurality of layers of semi-conductor materials may be obtained by epitaxy.

The zones in second semi-conductor material may be formed flush with the surface of the initial substrate.

They may also be formed up to a level situated above or below the surface of the substrate. Planarisation methods may be used to reduce this level difference. An additional material may also be, or not, deposited to make up the difference between the level of the second semi-conductor and the surface of the substrate.

The invention also concerns a hybrid layer device (for example semi-conductor), comprising a support substrate, a continuous layer of a buried dielectric and, on this layer, a hybrid layer comprising alternating zones of a first material and at least one second material, these two materials being different by their nature, and/or their composition and/or their crystallographic characteristics.

Examples of semi-conductor materials that could be used in a method or a device according to the invention, are as follows:
  a first and second semi-conductor materials both in silicon, with crystalline orientations of different directions,
  a first semi-conductor material in germanium and a second semi-conductor material in silicon, or even in gallium arsenide; the invention may therefore concern, in this case, a co-integration from an electrical point of view but also from an optical and electrical point of view.

The hybrid layer may comprise alternating zones of a first material, for example a semi-conductor and a plurality of second materials, for example semi-conductors, wherein the plurality of second materials, for example semi-conductors, may comprise a plurality of layers of materials, for example semi-conductors.

The zones in second semi-conductor material may be formed flush with the surface of the semi-conductor substrate, or even up to a level situated above or below the surface of the semi-conductor substrate. In this second case, a material, for example electrical insulator, may be or not deposited to make up the difference between the level of the second material, for example semi-conductor and the surface of the initial substrate.

Unlike known techniques, the invention enables a hybrid film to be produced on a continuous dielectric. Furthermore, it enables the surface properties to be controlled as a function of the technique used (use of a buffer substrate or not).

DETAILED DESCRIPTION OF SPECIFIC EMBODIMENTS

A first detailed embodiment is explained in liaison with FIGS. 1A-1H and 1I-1L.

Figure 1A:
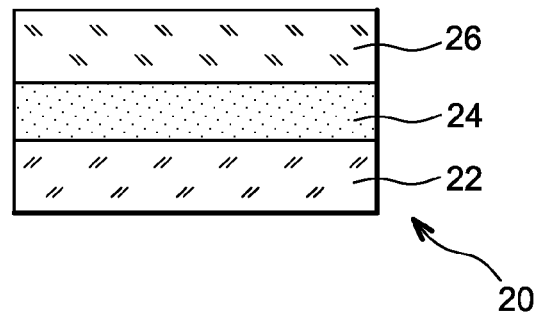
FIGS. 1A-1E, and 1I-1K and 10 represent steps of a method for producing a component with a view to the formation of a hybrid structure according to the invention.
Figure 1B:
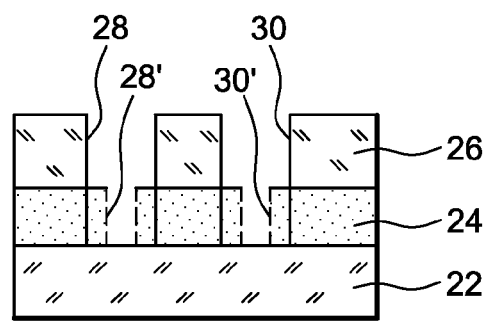
Figure 1C:
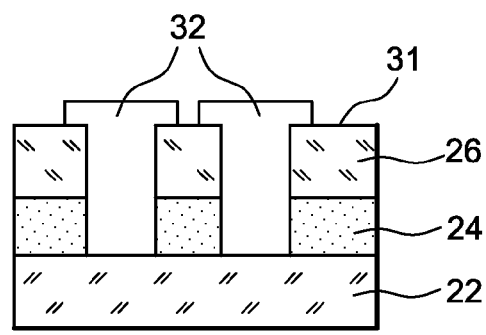
Figure 1D:
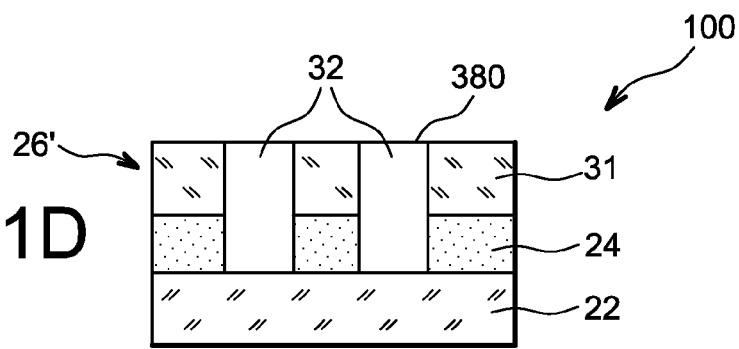
Figure 1E:
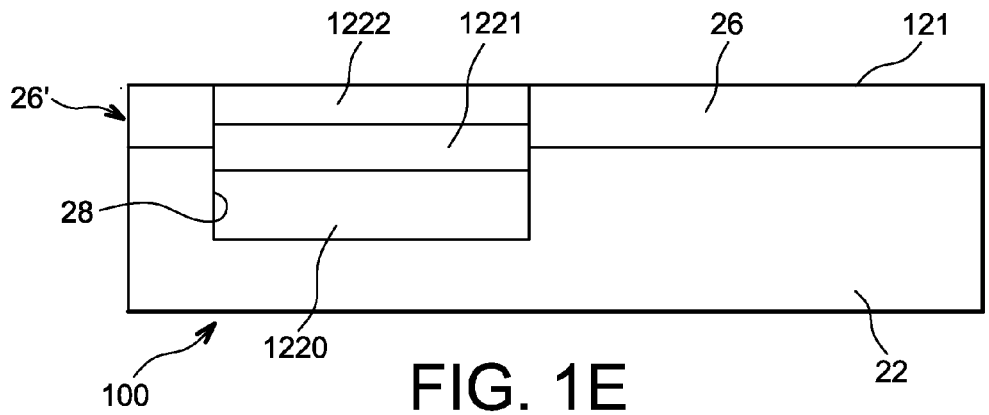
Figure 1F:
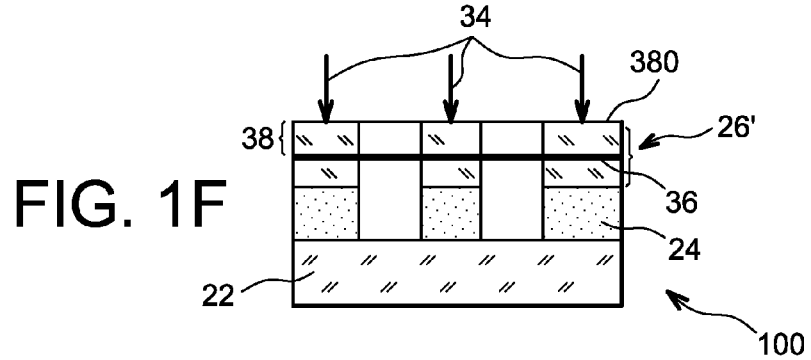
FIGS. 1F-1H, and 1L represent steps of a first method for producing a hybrid structure according to the invention.
Figure 1G:
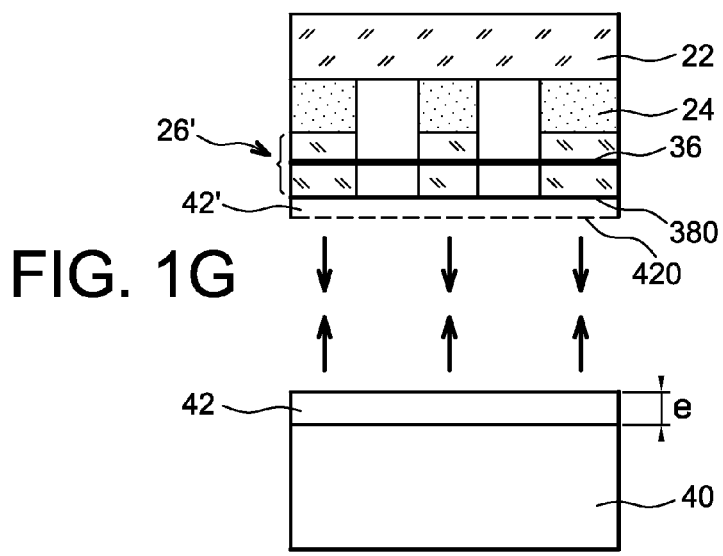
Figure 1H:
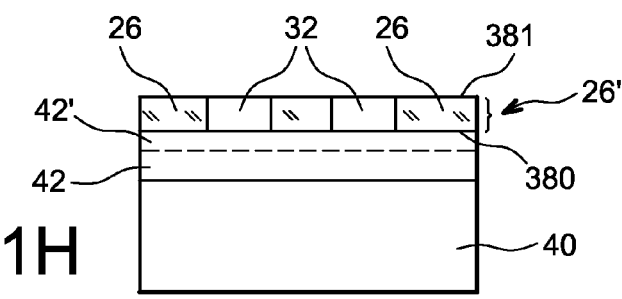
Figure 1I:
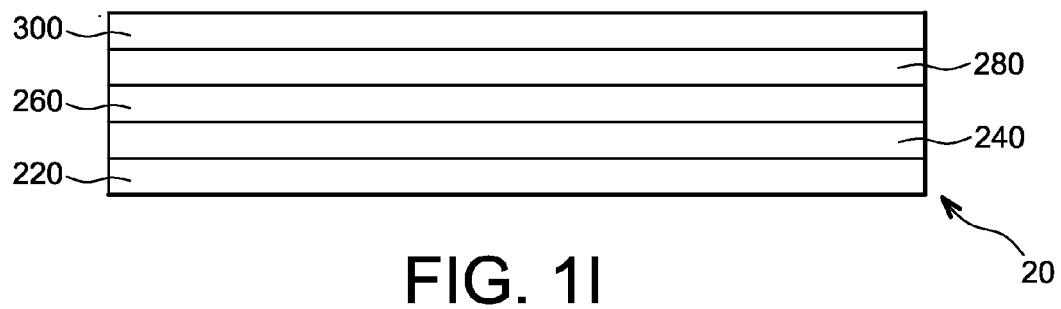
Figure 1J:
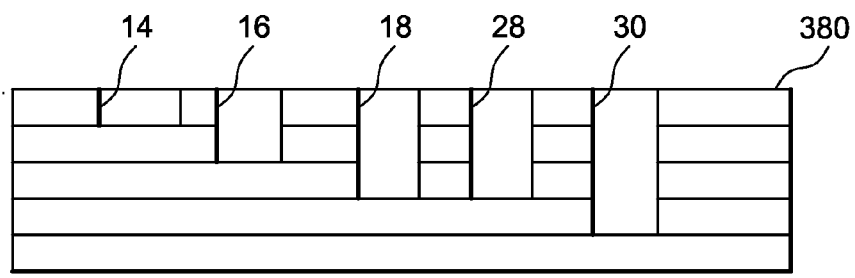
Figure 1K:
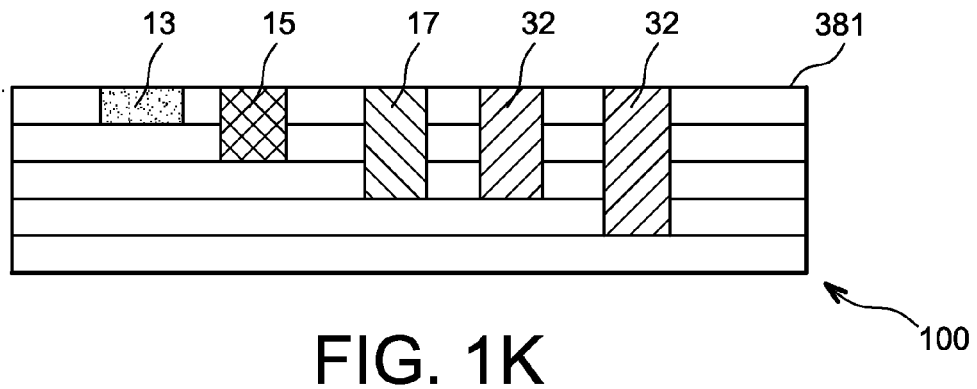
Figure 1L:
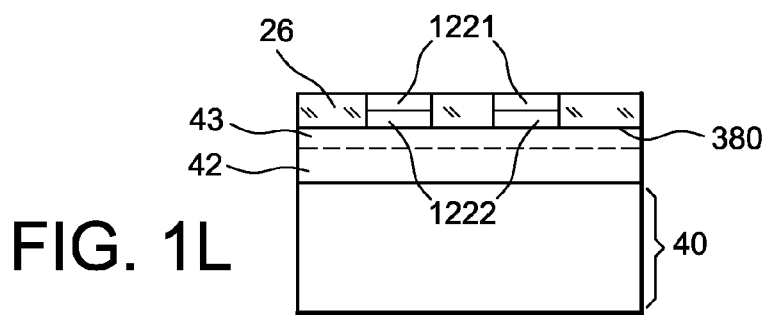

It involves a method for producing a hybrid substrate with the presence of a continuous layer of a buried electrical insulator, or even a hybrid layer 26' on a continuous layer 42 of a buried electrical insulator, that itself lies on a substrate 40 (FIGS. 1H and 1L). As explained below, this continuous buried insulator layer may be composed of two layers 42, 42'.

For reasons of clarity, the case of a hybrid layer of a same material having a first crystalline orientation "A", for example (110), and a second crystalline orientation "B", for example (100) will be detailed.

However, a hybrid layer with other combinations of materials may be formed, either, more generally, a combination of zones of a first material and a second material different from the first material by its physical properties such as, for example, its nature and/or its crystallographic characteristics.

In the case where these materials are semi-conductor materials, Si (first semi-conductor material) and $Si_xGe_{1-x}$ (second semi-conductor material), or $Si_xGe_{1-x}$ (first semi-conductor material) and $Si_yGe_{1-y}$ (second semi-conductor material) etc., may be chosen. Hereafter, most of the examples concern semi-conductor materials. But the invention is not uniquely restricted to an application to semi-conductor materials.

Moreover, the hybrid layer 26' may comprise more than two different materials.

In a first step (FIG. 1A), a substrate 20 constituted of a superposition of at least one layer 26 of orientation A (first material) is selected, and a substrate or a layer 22 of orientation B, homogeneous, with, or not, the presence of a layer, 24, separating the layers 22 and 26. Hereafter, second material refers to the material 32 (see FIG. 1D) that constitutes, with the first material, the hybrid layer and which is obtained, for example, by growth in the trenches, or obtained by deposition then thermal treatment or by amorphisation then thermal treatment. The substrate or the layer 22 constitutes a third material, suited to receiving the second material as a function of the method used to form it.

The intermediate layer 24 is optional and may be constituted of a dielectric or any other type of material, semiconductor or not.

Moreover, in the embodiment illustrated in liaison with FIGS. 1A-1H, but also in the other embodiments, even though the example illustrated concerns an initial substrate comprising 3 layers (such as the layers 22, 24, 26 of FIG. 1A), the invention can apply to any number n of layers, where n>3. For example, FIG. 1I represents the case of an initial substrate 20 comprising n=5 layers 220, 240, 260, 280, 300. For example layer 220 is a layer identical or similar to layer 22 of FIG. 1A, layer 240 is a layer identical or similar to layer 24 of FIG. 1A, layer 260 is a layer identical or similar to layer 26 of FIG. 1A, layer 280 being different from layer 260 and layer 300 being different from layer 280. Layer 280 is for example different by its nature and/or its crystallographic characteristics from layer 260 and layer 300 is different by its nature and/or its crystallographic characteristics from layer 280.

More generally an initial substrate for the invention comprises a stack of layers comprises n layers, each layer being different by its nature and/or its crystallographic characteristics from the immediately underlying layer.

During a second step, the initial substrate 20 is prepared: trenches (or caissons or cavities) 28, 30 are etched down to the substrate or down to the homogeneous layer 22 or to any other layer in the case of any number n of layers, for example n>3 (see FIG. 1J for example).

For this step, a narrow trench 28', 30' down to the homogeneous substrate 22, or to the layer of interest, may firstly be produced, and then a more important lateral etching of the layer 26 (first material), or of any other layer in the more general case of a total number of layers higher than 3, may be carried out so as to obtain the desired width of the trenches 28, 30.

The interest of the layer 24 is then to enable these wide etched zones 28-30 with narrow "seeding points" 28'-30' to be produced, the layer 24 playing for example a role of barrier layer. Thus, in FIG. 1B, the widths of these zones 28-30, which are found in the film 26, are greater than the widths of the etched zones 28'-30' which are only found, for their part, in the intermediate layer 24.

In a third step (FIG. 1C) the hybrid layer is formed.

For this step, the previously formed cavities 28, 30 are filled with the second material 32 (for example Si) which is, in the example considered, of the same crystalline orientation as the material of the layer or of the substrate 22 (here a material of orientation B).

If the initial substrate 20 has not been etched (in which case trenches 28, 30 are not formed), a situation that is illustrated in FIG. 1O, a technique of local amorphisation then recrystallisation may then be employed, where:

a) certain zones, in fact the zones 32 of FIG. 1O, are amorphised by implantation.

b) then a controlled rise in temperature makes it possible to re-crystallise the layer with a preferential orientation identical to that of the material of the layer 22, in particular in the case where the layer 24 does not exist; in this case, the control of the grain boundaries makes it possible to guarantee that the crystalline orientation, during the re-crystallisation, is imposed by the material of the layer 22, and that the second material 32, thereby generated, is effectively crystalline, particularly at the level of the hybrid zone formed in the layer 26, a hybrid zone that will later be transferred. A recrystallisation from the layer 24 can also take place, in the case, for example, where this layer is in LaTiO3 or in SrTiO3.

According to another approach (with or without layer 24), a deposition of amorphous silicon may be carried out after definition of the trenches, or caissons or cavities, followed by an appropriate thermal treatment, the role of which is similar to the previous case (cf. step b) above). Advantageously, the first material 26 may be protected to avoid a growth in excessive thickness of the second material 32.

According to yet another approach, more general, whether the structure 20 has, or not, an intermediate layer 24, a step of growth of the second material 32 may be used, for example in silicon, by a standard epitaxy technique. Advantageously, the first material 26 may be protected to avoid growth in excessive thickness of the second material 32. The epitaxy may be preceded by a passivation of the sides at the level of the trenches, or caissons or cavities, 28',30' and/or 28,30 in order to avoid any start of growth at the level of the layer 26 and in order to guarantee that the crystalline orientation of the final hybrid zone indeed has a crystalline orientation imposed by the material of the layer 22 and not by the layer 26.

FIG. 1E represents another example of a component obtained according to the invention: the initial component 20 does not comprise an intermediate layer 24, but comprises a substrate 22, for example in germanium, and a layer 26, in a first material, for example in silicon, formed or deposited on the substrate 22. A single cavity or trench 28, etched in the initial layer 26, is represented in this figure. In this cavity, it is not a single material that has been epitaxied, but a plurality of layers 1220, 1221, 1222 of different materials. Such epitaxial growth of a plurality of layers may be carried out in one or several etched zones in the initial substrate 20. In the component 100 obtained, the hybrid layer 26' is therefore formed by alternating zones 26 of the first material and zones of several stacked materials in the form of layers.

FIGS. 1J and 1K represent the steps of treatment of an initial substrate with several layers such as that of FIG. 1I. At least one trench, here 5 trenches, or cavities or caissons, 14, 16, 18, 28, 30, is or are etched down to the desired layer. Each trench, or cavity or caisson, is then filled with a material 13, 15, 17, 32. Certain of these materials may be identical. For example the trenches or cavities or caissons 28 and 30 are filled with the same material 32, the four other trenches or cavities or caissons being filled with materials different to each other and different to the material 32. This may result from the different material of the layer at which the bottom of the trench is located; as explained above the material filling a trench can have the same crystalline orientation as the material of the layer where the bottom of the trench is located or properties like crystalline orientation may be imposed by the material of said layer.

The trenches are filled with one or more of the techniques explained above:

filling with a material which, for example has the same crystalline orientation as the layer reached by the bottom of the trench;

or deposition of amorphous semiconductor material, for example Si, followed by a thermal treatment;

or growth of material by epitaxy.

It is also possible not to realise trenches and to use a technique of local amorphisation then recrystallisation (see above).

In a device as illustrated on FIG. 1K (or in any other device according to the present invention), the bottom of a trench, or a cavity or a caisson, can be at a depth under surface 381 which is different from the depth at which the bottom of another trench, or cavity or caisson of the same device is located. It is thus possible to realize a device having different (at least two) trenches (or cavities or caissons) etched down to different depths or layers: for example, the bottom part of trench 30 (see FIG. 1J) is located at a depth different from the depth at which the bottom part of trench 28 is located, and the bottom part of trench 28 is located at a depth different from the depth at which the bottom part of trench 16 is located . . . etc The invention concerns in particular a structure comprising a plurality of layers, as illustrated for example on FIG. 1K, in which a plurality of trenches or cavities or caissons is etched, and then filled with material, the bottom of at least one of said trenches or cavities or caissons being at or in a layer, under the surface of the structure, different from the layer at or in which the bottom of another one of said trenches or cavities or caissons is located. Each of said at least two trenches is filled with a material, for example semiconductor material, which is different from the material with which the other trench is filled, for example by having different physical properties or different crystalline orientations as explained above.

Whatever the embodiment, a preparation step by surface treatment (by surface passivation and/or oxidation, and/or deposition of barrier layers such as $Si_3N_4$ and/or $SiO_2$ and/or any other type of material and/or activation by plasma) may be carried out before a subsequent bonding step.

The final height of the epitaxy material(s) 13, 15, 17, 32 may be adjusted (like that of the barrier layers) in order to be able to erase all of the rough edges of the surface 121, 380, 381, for example due to an excessive thickness of a zone 32 of the second material (both here and hereafter the sole reference 32 is used, but the entire description that follows also applies for a plurality of materials as illustrated in FIG. 1K) compared to a zone 31 of the first material. The problem of surface condition is also posed when the technique of FIG. 1O is used, not exactly in the same terms, but in the sense that the change of nature of the zone 32 of FIG. 1O leads to a modification of its surface, which will no longer be "similar" to that of the layer 26. It is thereby possible to obtain a structure 100 or 20 (FIG. 1D or 1E or 1K or 10), the surface 380, 121, 381 of which is compatible with the specificities of microelectronics (planeness, roughness, etc.) and is, like the superficial layer 26', of hybrid type, in other words it has an alternation of zones 31 of the first material and zones 32 of the second material. For this purpose, it is possible to use for example chemical mechanical polishing (CMP), or chemical and/or one or several thermal treatments, and/or one or several plasma treatments, in which the selectivity between the two materials in the example chosen may be advantageously exploited.

Hereafter, examples of carrying out steps that may follow the previous steps are given.

In these different examples described hereafter, a transfer of the hybrid layer 26' is carried out. This transfer particularly uses a thinning of the substrate 100 of FIG. 1D or 1E or 1K, wherein said thinning may be carried out by various techniques and particularly by implantation, in this substrate, of ions or of atoms to form a fracture plane, then a fracture along said plane.

The step of implantation leading to the formation of this fracture zone may be carried out:

in the hybrid film 26', to define a fracture zone 36 there, as illustrated in FIG. 1F, or then in the layer or the homogeneous substrate 22 (see particularly the example 2 below, FIGS. 2A-2D).

The choice between these possibilities may be made as a function of the dimensions of the trenches 28', 30' formed for the epitaxy, depending on whether these dimensions enable, or not, an adequate thinning as well as a levelling of the trenches or cavities or caissons 28',30' and the freed surface.

Reference is made hereafter on several occasions to "Smart Cut™" technology. An example of this technique is described in the article of A. J. Auberton-Hervé et al. "Why can Smart-Cut change the future of microelectronics?" published in International Journal of High Speed Electronics and Systems, Vol. 10, No. 1 (2000), p. 131-146.

EXAMPLE 1

The aim is to adapt the surface condition of a structure 100 of the type of that described above in liaison with FIG. 1D or 1E or 1K, obtained, for example, by epitaxy then surface preparation, or by any other preparation technique mentioned. It is aimed to control this surface condition for its importance, for example in the use of Smart Cut™ technology, in terms of surface morphology (planeness, roughness, etc.) and physical/chemical properties (contamination, hydrophily, etc.). For this purpose, treatments by chemistry, and/or by CMP, and/or by oxidation, and/or by plasma implantation, etc., are implemented. The surface may thus be prepared and adapted to comply with the specificities of layer transfer techniques.

The following steps of this type of treatment may be steps of implantation of the structure 100 then transfer.

As illustrated in FIG. 1F, a fracture plane 36 is formed by an implantation 34 of ions or of atoms in the film or the hybrid layer 26'. The implantation may be carried out according to techniques such as a localised masking, to assure that the embrittlement will be in a plane, in spite of the materials crossed through, which may be very different to each other and in which the implantation depths may be different.

A dielectric layer 42', 42, for example an oxide, is formed by deposition or growth, on the structure 100 and/or on an assembly substrate 40 (FIG. 1G); if appropriate, a deposition 42' on the structure 100 may be carried out before or after the implantation. Each of these layers 42, 42' is a dielectric or other, for example a layer of oxide, or nitride, or oxide/nitride or other (FIG. 1G).

The implanted substrate, provided if appropriate with the layer 42', is then assembled on a recipient substrate 40, provided if appropriate with a dielectric layer 42.

The assembly face of the implanted substrate is the face 380, 121 (for example the post-epitaxy face in the case where the growth of the material 32 has been obtained by epitaxy; same assembly face for the case where there is amorphisation), which has been crossed by the beam 34 (FIG. 1F); this face is brought into contact with the layer 42 (if it is present). If a layer 42' has been formed on the structure 100, the assembly face of the implanted substrate is then the surface 420 of this layer 42' (FIG. 1G).

According to another embodiment, and after assembly with a substrate 40 (covered if appropriate by a layer 42, FIG. 1G) a mechanical thinning is carried out, for example by grinding, or lapping, or polishing etc., of the structure 100, from the layer 22, up to within the layer 26', thus without prior implantation of ions or of atoms 34, or fracture. This step may also be combined with a wet or dry route chemical treatment and/or thermal treatments and/or plasma treatments facilitating the thinning.

By thinning, or by fracture along the plane 36, all the part of the substrate 100 comprising the layer 22, the layer 24 if any (this has been modified locally on account of the trenches filled with second material 32) and a part of the layer 26' are thus eliminated. The final structure (FIG. 1H), obtained after transfer and thinning, comprises a hybrid layer (orientation B/orientation A in the example considered; but, more generally: second material 32/first material 26 or, even more generally: plurality of second materials 13, 15, 17, 32/first material 26) on the layer(s) 42 and/or 42'. This hybrid layer results from the layer 26'. The surface 381, which results from the fracture along the plane 36 and/or from a thinning up to within the layer 26', may then be prepared to comply with the present standard for microelectronics in terms of planeness, roughness, crystallinity, etc.

FIG. 1L represents the case where the first material alternates, in the hybrid layer, with a plurality of second materials 1222, 1221 formed in layers (here only two layers), from an initial substrate like that of FIG. 1E. The stacking order of the layers is the inverse of that of FIG. 1E (here: layer 1222 towards the substrate 40 and layer 1221 towards the surface 381).

EXAMPLE 2

As already indicated above, the topography of the structure 100 may have an importance in certain final structures, for example on account of compatibilities with Smart Cut™ technology.

If the condition of the surface 380, 121, on account of its macroscopic properties (roughness, uniformity, etc.), is a limitation to certain applications particularly vis-à-vis layer transfer methods (and particularly if a bonding by molecular adhesion following a fracture step such as carried out in "Smart Cut™" technology is employed), it is possible to produce, according to the present example 2, another type of transfer in order to be freed from this surface 380, 121. The surface between the layer 26' and the layer 24 of FIG. 1D is then used as bonding interface by passing by means of an intermediate buffer substrate. In the case of FIGS. 1E and 1K, the implantation depth may be adjusted to define the most judicious position for the fracture plane.

The structure 100 is prepared by carrying out on its surface 380, 121 (which is also the free face of the hybrid layer 26') a deposition of a layer 73 (FIG. 2A), for example a dielectric layer such as a layer of oxide; if appropriate the deposition of this dielectric layer may be carried out after implantation; it is also possible to carry out a superficial oxidation of the hybrid layer 26'. The other face of the hybrid layer 26', liberated during the method, is intended to be assembled with the final substrate 40, or with an insulator layer 42 formed on this final substrate (see FIG. 2D).

Figure 2A:
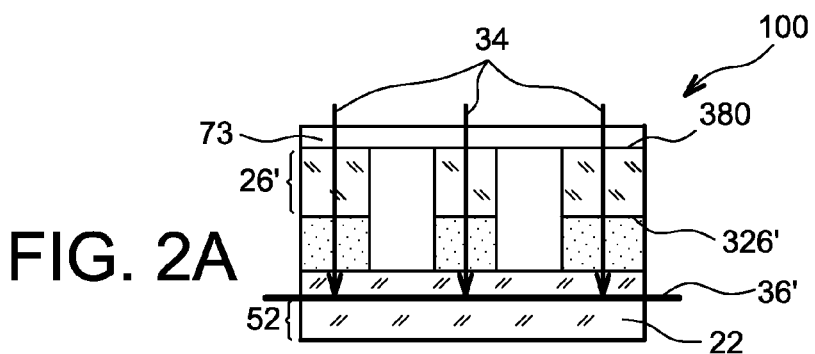
FIGS. 2A-2D represent steps of a second method for producing a hybrid structure according to the invention.
Figure 2B:
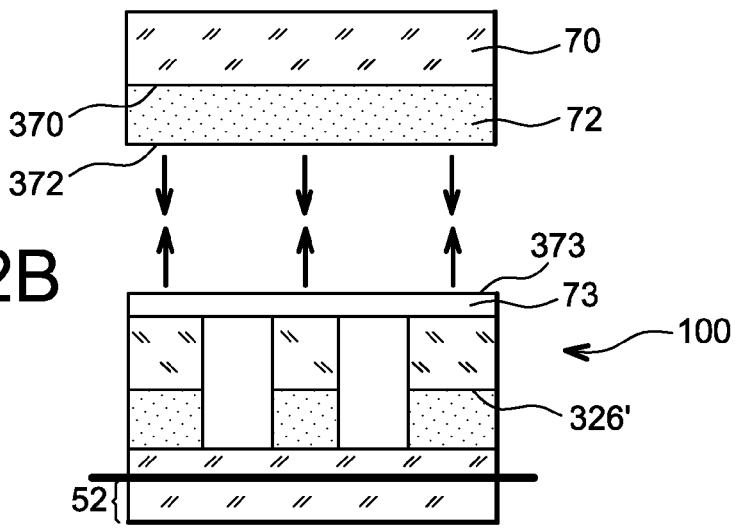

This deposition or this oxidation takes place at least on the surface 380, 121 to then undergo a step of planarisation enabling a subsequent bonding with a buffer substrate 70, which is covered, or not, with a dielectric layer 72 (see FIG. 2B).

In this example, the implantation step is carried out in the carrier substrate 22 (FIG. 2A) where a fracture plane 36' is thereby defined. Said plane, in its turn, will enable a part 52 of this carrier substrate 22 to be separated.

This step is often facilitated if a structure 20 (FIG. 1A) not comprising an intermediate layer 24 has been used initially: the fracture plane 36' is, in fact, then defined in a homogeneous material rather than in a mixed zone 24, which facilitates the transfer and, especially, the final treatment of the film (the mixed zone 24 of FIG. 1D does not have to be levelled).

A step of bonding of the component 100 with a buffer substrate 70 is then carried out (FIG. 2B), wherein said latter substrate is provided with, or not, a dielectric layer 72. The component 100 is assembled by the surface 373 of the layer 73, or by the surface 380 if the layer 73 is not present. This assembly face of the component 100 is prepared to make it suited to the bonding on the surface 370 of the buffer substrate 70 or on the surface 372 of the layer 72 (FIG. 2B). It is after this bonding that a step of fracture may be carried out, thanks to the implantation, enabling the part 52 of the carrier substrate 22 to be eliminated.

As already indicated within the scope of example 1, according to another embodiment, a mechanical thinning of the stacked structure of FIG. 2B is carried out, after the bonding with the buffer substrate 70, this time up to elimination of a part 52 of the initial carrier substrate 22; once again this alternative does not require either implantation 34 or fracture along an implantation plane 36'. This step may also be combined with a chemical treatment facilitating the thinning.

Figure 2C:
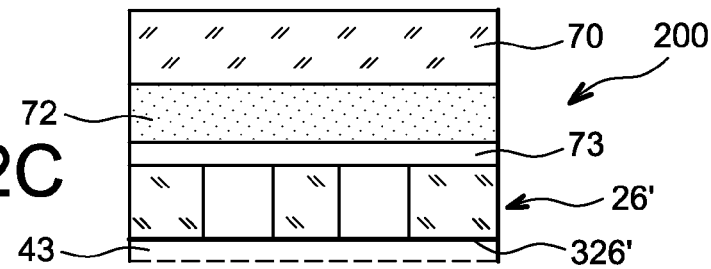

The whole assembly is then thinned by removing the remainder of the carrier substrate 22 and if appropriate the layer 24; in this way, the face 326' of the hybrid layer 26' (FIG. 2C) is freed, and the structure 200 of FIG. 2C, with hybrid layer 26', is thereby obtained if appropriate on insulator layers 72-73 and on a "buffer" or handle substrate 70.

Figure 2D:
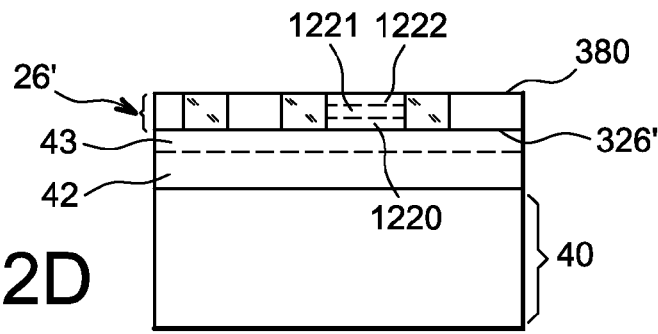

This latter structure 200, or rather the hybrid layer, provided or not with a dielectric layer 43, is then bonded onto the final substrate 40, provided or not with its layer 42; then the buffer substrate 70, and if appropriate the layers 72-73, are removed (FIG. 2D).

Unlike the previous approach (example 1), the final free surface, according to the present approach, is constituted by the surface 380, 121 obtained after epitaxy, or after amorphisation, which may if appropriate comply with the specificities fixed for example by the CMOS technologies that will follow. In this example, it is the interface 326' that is in contact with the stack 42-43 whereas, in the previous example, it was the initially free surface 380, 121 (see FIGS. 1F, 1G and 1H) that had been bonded.

FIG. 2D also represents the case where the first material alternates with a plurality of second materials 1220, 1221, 1222 formed in layers, from an initial substrate like that of FIG. 1E. This time, unlike FIG. 1L, the order of layers from the substrate 40 towards the surface 380 is the same as that of FIG. 1E (here: layer 1220 towards the substrate 40, intermediate layer 1221 and layer 1222 towards the surface 380).

In both cases (example 1 and example 2) an assembly comprising a substrate 40, a continuous insulator layer, and a hybrid layer is obtained.

EXAMPLE 3

The present example is particularly useful in the case where the "rear" interface between the layers 22 and 24, (or 22 and 26 if there is no layer 24), is not adapted, since degraded by the steps of the methods described above in liaison with FIGS. 1B to 1E or 1J to 1K. It is considered that the surface 380, 121 is adapted to the final envisaged applications (microelectronics, optoelectronics, etc.).

As indicated previously, the post-epitaxy surface 380, 121 may pose a problem with a view to a bonding by molecular adhesion, for example as employed in Smart Cut™ technology, but may comply with the subsequent methods.

A second problem resides in the interface 326', referred to as the "rear" interface, of the hybrid film 26', after epitaxy. Indeed, this interface can have variable properties, for example on account of the lateral etching brought into play to produce the caissons (caissons of orientation "B" (100) in the previous example). If no etching is carried out, it can also not be compatible for reasons such as grain boundaries or others.

Figure 3A:
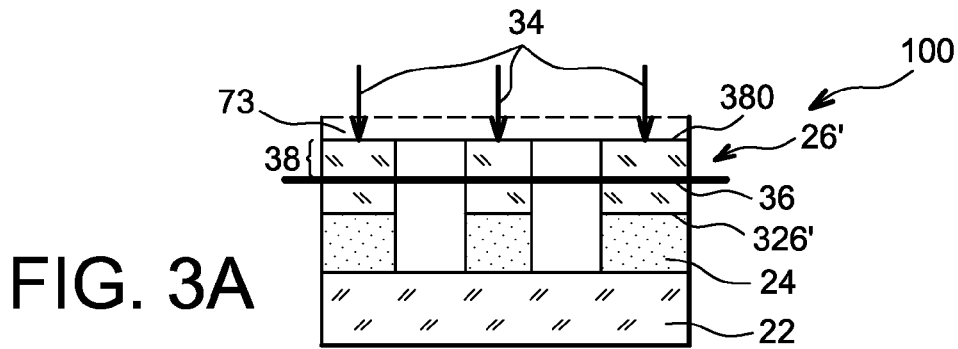
FIGS. 3A-3C represent steps of a third method for producing a hybrid structure according to the invention.

In order to resolve these problems, and according to the present example 3, an intermediate buffer substrate 70 is used, as in the previous example. On the other hand, an implantation 34 is carried out in the hybrid film 26' itself (FIG. 3A).

If appropriate, it is possible to prepare the structure 100 by carrying out on its surface 380, 121 (which is also the free face of the hybrid layer 26') a deposition of a layer, for example dielectric 73, for example again a layer of oxide; the deposition of this layer may be carried out before or after implantation 34; it is also possible to carry out a superficial oxidation of the surface 380 of the hybrid layer 26'.

The implantation beam 34 enables a fracture plane 36 to be defined, this time in the hybrid layer 26'. Said plane will enable a part 38 of the hybrid zone formed previously to be separated. The implantation will be carried out, or not, through the film 73 that will be conserved, or not, during the subsequent step of bonding with the buffer substrate.

A first fracture (separation step according to "Smart Cut™" technology) is made along this plane 36, after bonding with a layer 72, for example a dielectric layer, preferably thick, integral with a buffer substrate 70 (FIG. 3B), or after bonding directly on the buffer substrate 70.

The surface then to be bonded, on the substrate 40 provided with, or not, an insulator layer 42, is the surface 360 that results from this fracture operation. On this surface 360 may be deposited, or not, a layer 43, for example a dielectric layer. One of these two layers 42 and/or 43 has the property of dielectric. This surface may be prepared and adapted for a second bonding according to conventional methods (chemical, and/or CMP, and/or plasma, and/or oxidation etc.) The fact of using a surface 360 of "after Smart Cut™ technology" type is advantageous since the properties of this surface may be controlled. This control is important, in particular in the case where the initial rear interface may be limiting. For example if the second material 32 is obtained by EOL deposition for example (which corresponds to the case of cavities in the film 26 larger than in the film 24 or the material 22), the interface with the material 22 or 24 may be highly defective.

A bonding of this surface 360 on a substrate 40, provided with, or not, an insulator layer 42 (see for example the oxide layer 42 of FIG. 3C) is then carried out. The buffer substrate 70 (FIG. 3C) can then be removed and the layers 72-73, if any, eliminated. The dismantling may be carried out by means of one or several of the following techniques: mechanical or chemical technique or by dismantling, or lift off.

Alternatively, it is also possible to use "Smart Cut™" technology with implantation, before the bonding step, and formation of a fracture plane in the substrate 70 or in one of the layers 72 or 73 (if this implanted layer is not dielectric).

The difference between examples 2 and 3 therefore mainly resides in the nature of the surface that is going to be bonded, in the end, on a substrate 40 (if appropriate via the layers 42-43): in the case of example 2, it involves the interface between the hybrid layer 26' and, either the intermediate layer 24, or the substrate 22; within the scope of example 3, it involves a surface that results from a fracture made in the thickness of the hybrid layer 26'.

Unlike example 1, the free final surface, according to the present example 3, is, as in the case of example 2, constituted by the surface 380 (obtained after epitaxy or amorphisation and thermal treatment), which can comply with the specificities fixed by the final applications of the structure (microelectronics, optoelectronics, etc.).

Figure 3B:
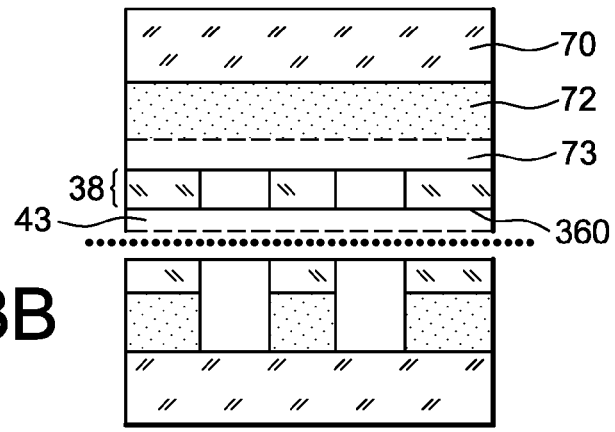
Figure 3C:
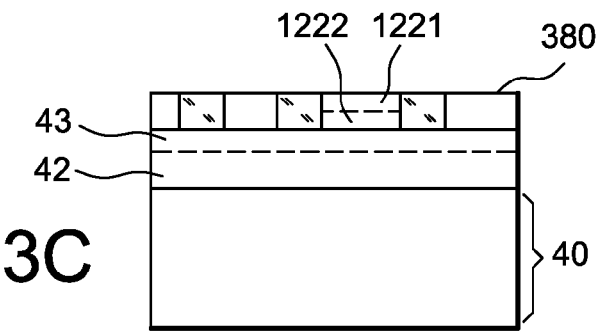

FIG. 3C also represents the case where the first material alternates with a plurality of second materials 1221, 1222 formed in layers from an initial substrate like that of FIG. 1E. Once again, unlike FIG. 1L, the order of the layers from the substrate 40 towards the surface 380 is the same as that of FIG. 1E (here: layer 1221 towards the substrate 40, and layer 1222 towards the surface 380).

EXAMPLE 4

In this example, it is assumed that neither the interface between the layers 22 and 24 (or between the layers 22 and 26) nor the surface 380, 121 are compatible with the specificities required for the final applications (microelectronics, etc.).

In the previous example 3, a surface 360 stemming from the fracture step (for example by Smart Cut™ technology) was bonded in the hybrid layer. In the present example 4, the final surface of the substrate again stems from the fracture step (once again preferably by "Smart Cut™" technology).

This example 4 employs steps common with the previous example, except in the final transfer of the layer. Indeed, it is only a part 38' of the portion 38, obtained by fracture of the hybrid layer 26', that will be transferred. In fact, according to this example 4, the portion 38 of the hybrid layer 26' also undergoes an implantation, in order to enable a second fracture in this hybrid layer.

The two first steps are therefore similar to those described above in liaison with FIGS. 3A and 3B.

Figure 4A:
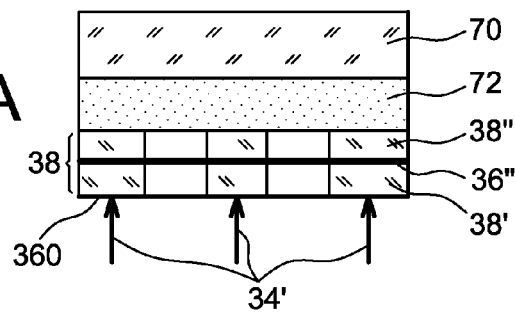
FIGS. 4A and 4B represent steps of a fourth method for producing a hybrid structure according to the invention.

After elimination of a part of the substrate 100 (layers 22, 24 and a first part of the layer 26' on account of the first fracture along the plane 36) a second embrittlement plane is formed in the film 38 bonded onto, or assembled with, its buffer substrate 70 with the layers 72-73 if any. Thus, in FIG. 4A, is represented a second implantation beam 34'. It enables a second fracture plane 36" to be defined, this time in the portion 38 of the hybrid layer (FIG. 3B).

Then, the hybrid layer 38' (FIG. 4B) is bonded and transferred, by fracture along this second plane 36". The fracture enables a layer or part 38' of the portion 38 initially separated from the hybrid layer 26' to be separated along the plane 36". Another sub-layer or part 38" of this hybrid layer 38 remains linked to the buffer substrate 70 after fracture along this plane 36".

In the end, the bonded interface will be a surface 360 resulting from a fracture operation (this surface is of the "post Smart Cut™" technology type). If it is observed that the surface 380 above is also of the same type as the surface 360, it will be understood that this approach enables for example the problems of inhomogeneity noted after epitaxy to be resolved.

In other words, this embodiment enables a hybrid layer having two surfaces each resulting from a fracture operation to be obtained.

Figure 4B:
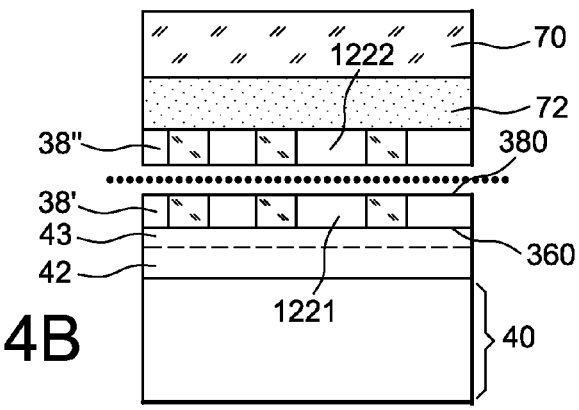

FIG. 4B also represents the case where the first material alternates with a plurality of second materials 1221, 1222 formed in layers, from an initial substrate like that of 1E. Once again, unlike FIG. 1L, the order of the layers from the substrate 40 towards the surface 380 is the same as that of FIG. 1E (here: layer 1221 towards the substrate 40, and layer 1222 towards the surface 380). But the operation of fracture along the plane 36" can lead to separating these layers from each other, thus in FIG. 4B is represented the case where the layer 1222 (brought by the buffer substrate 70) is separated from the layer 1221, only said latter layer remaining on the substrate 40 or on the oxide 42-43.

Another embodiment of the invention will now be described.

Once again it involves a locally structured film transfer method moreover enabling a continuous buried dielectric underneath a hybrid film to be formed.

But the initial substrate is different, because it is composed of an initial layer of a first material, wherein said layer may be self-supporting or supported by a carrier substrate. Trenches are then formed, then an epitaxy carried out, directly in this homogeneous layer of a first material.

Figure 5A:
FIGS. 5A-5G represent steps of a fifth method according to the invention, with a view to the formation of a hybrid Ge/GaAs structure.

A first initial substrate is selected, in a first material 120 (FIG. 5A), for example in germanium (solid or bulk or resulting from a thick continuous epitaxy on a carrier substrate). This first material is preferably favourable to the epitaxy of compounds such as III-V, II-VI alloys, etc. Cavities 122, 124 are formed in this substrate by local etching (FIG. 5B), the depth of which may be or not controlled so that it represents the final thickness of the hybrid film that will be subsequently transferred onto a buffer (470) or final (140) substrate.

Figure 5B:
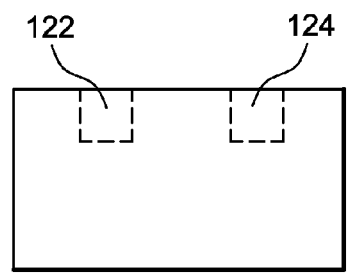
Figure 5C:
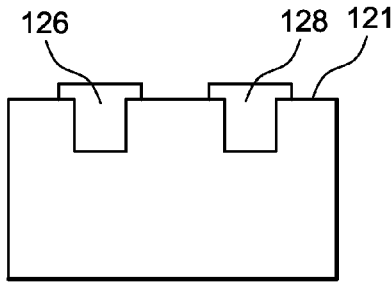

An epitaxy of a second material 126, 128 is then carried out, for example of GaAs (or, more generally, of a semiconductor III-V, or II-VI alloy) over the entire depth of each trench 122, 124 (FIG. 5C). If appropriate, the materials 126, 128 are different to each other. According to yet another alternative, it is also possible to carry out, in the trenches 122, 124, multiple epitaxies with a view to producing a composite stack. For example, in the case of a substrate 120 in germanium, it is possible to grow GaAs in the trenches, but also alloys: according to one example, a thin film of GaAs is epitaxied then, above, for example AlGaAs, then for example again, AlGaN above the AlGaAs. The trenches 122,124 are therefore not filled with a single unique material. The second material 126, 128 may therefore be composite, in multiple layers, depending on the final material that it is desired to have within the trench.

Figure 5D:
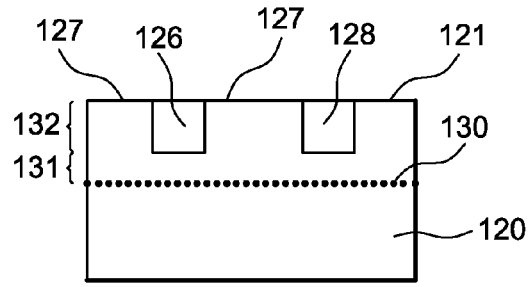

A step of polishing and/or thermal treatment and/or chemical treatment and/or plasma treatment enables the level of epitaxied GaAs 126, 128 to be brought back to the level of the surface 121 of the substrate 120 (FIG. 5D). As with the previous examples, depositions of insulator of type $SiO_2$, or $Si_3N_4$, etc., may be carried out to help the preparation of the surface with a view to a subsequent bonding.

As already indicated, in liaison with the previous hybrid integration embodiments according to the invention, it is advantageously also possible to carry out, prior to the epitaxy:
- a passivation of the sides of the trenches 122, 124 to prevent them perturbing the growth,
- and/or if appropriate an engineering of the surface of these sides (deposition of layers/multilayers of dielectrics, etc.).

This step leads to the production, in the substrate 120, of a hybrid layer 132 comprising an alternation of zones 127 in first material, for example in Ge, and epitaxied zones 126, 128.

An implantation, with a view to a transfer, may then be carried out in the substrate 120 by the front face 121, in order to facilitate a subsequent step of thinning by fracture. The embrittlement plane 130 thereby obtained delimits a zone of the substrate comprising a layer 131 in material of the initial substrate 120 and the hybrid layer 132. Once again, a layer of insulator may be arranged before the implantation.

Figure 5E:
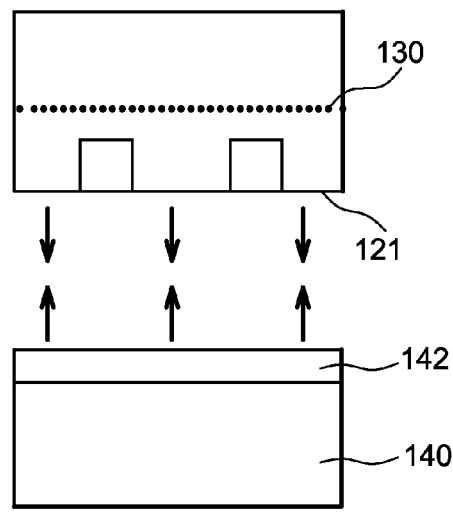

A bonding of the structure is then carried out with a support substrate 140 (FIG. 5E), if appropriate via a dielectric layer 142. Once again the bonding may be carried out with or without bonding dielectric layer, and if there is a bonding layer, it may be formed on the substrate 140 (layer 142 as in FIG. 5E) and/or on the surface 121.

Figure 5F:
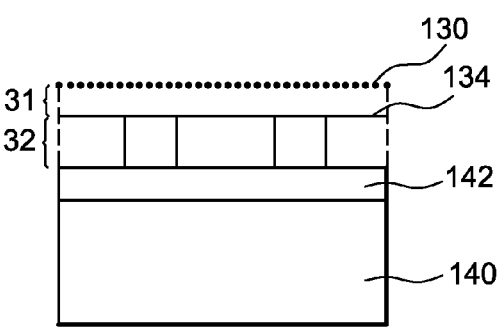
Figure 5G:
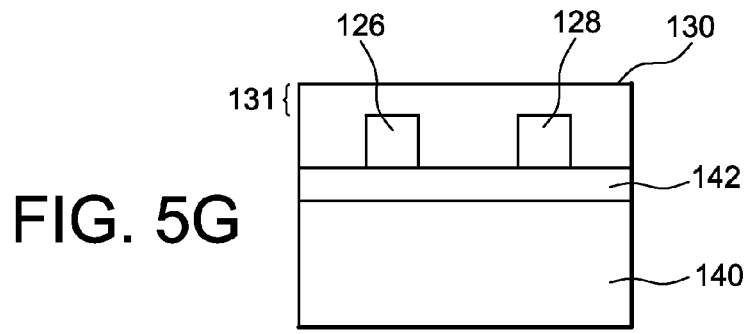

The fracture in the implantation plane enables the transfer of the layer 131 and the hybrid layer 132. It is then possible to obtain, by a more or less important thinning:
- a mixed free surface 134 (case of FIG. 5F), the hybrid layer 132, for example in Ge/GaAs, being uncovered; for this purpose, the part 131 of the substrate 120, situated between the hybrid layer 132 and the fracture plane 130 may be eliminated, for example by polishing, and/or chemical treatment, and/or plasma treatment, and/or thermal treatment, etc.;
- or buried caissons 126, 128, for example in GaAs (case of FIG. 5G); in this case, the part 131 of the substrate 120, situated between the hybrid layer 132 and the fracture plane 130 has not been totally eliminated. This layer is not eliminated after the transfer, but it may be eliminated later, all or part in its surface or its thickness, for example after having formed surface devices.

Instead of using the technique of fracture after implantation, it is possible to use, as a technique for removing a part of the initial support 120: a mechanical and/or chemical thinning, etc.

Various alternatives of this embodiment may be implemented: for instance it is possible, as in the previous embodiments (cf. examples 3 and 4 above) to position the implantation plane 130 in the hybrid layer 132. It is thereby possible to have a free final surface, such as the surface 134 of FIG. 5F which is the surface defined by the bottoms of the trenches 122, 124, or instead a surface that results from a fracture plane 130. Moreover, depending on the free surface that it is desired to obtain in the end, it is possible to use, or not, an intermediate buffer substrate. The use of an intermediate substrate makes it possible to have, as final free surface, the hybrid surface (designated overall by the reference 121 in FIG. 5D).

Finally, it is possible to carry out several steps of implantation in the hybrid layer 132, and several fractures along the different implantation planes thereby constituted, as in the case of example 4 described above and with the same advantages, in other words the possibility of having a hybrid layer in which the two surfaces (the free surface and the surface in contact with the final substrate 140 or with its dielectric layer 142) are fracture planes. If appropriate, the use of a buffer substrate enables the assembled surface and the free surface to be chosen.

Figure 6A:
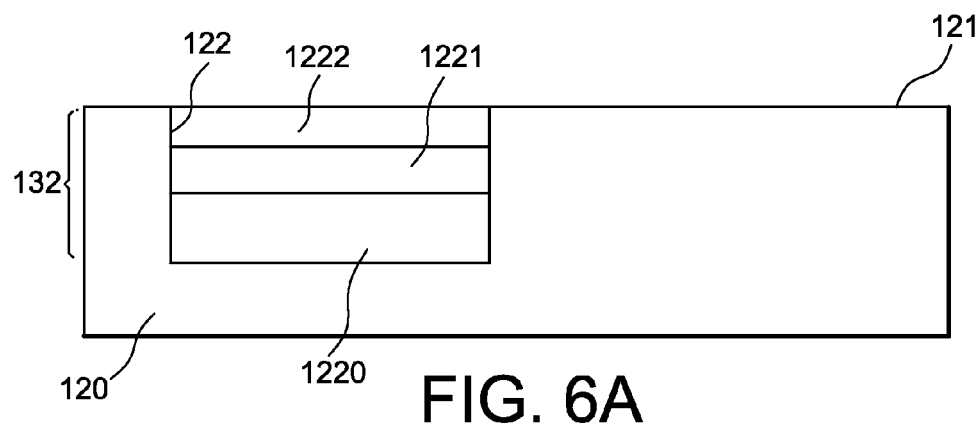
FIGS. 6A-6D represent steps of a sixth method according to the invention, with a view to the formation of a hybrid structure comprising layers of semi-conductor materials.

FIG. 6A concerns the case of an epitaxy, carried out in the trench 122 of the substrate 120 of FIG. 5B, which results from a stack of materials, for example a layer of GaAs 1220, a layer of InGaAs 1221 and a layer of InGasP 1222.

A trench with multiple materials 1220, 1221, 1222 may thus be obtained. One or several of these layers may be one or several adaptation layers. The layer 132 of the substrate 120 is a hybrid layer, with alternation of zones in a first material (that of the substrate 120) and zones in a second composite material formed of stacks 1220/1221/1222.

An implantation, with a view to a transfer, may then be carried out in the substrate 120, by the front face 121, in order to facilitate a subsequent step of thinning by fracture. The embrittlement plane 130 thereby obtained (FIG. 6B) delimits a zone of the substrate comprising for example a layer 131 in material of the initial substrate 120 and the hybrid layer 132.

Transfer by implantation then fracture is thus carried out; alternatively, a mechanical and/or chemical thinning is carried out, in which case no prior implantation step is necessary.

Figure 6B:
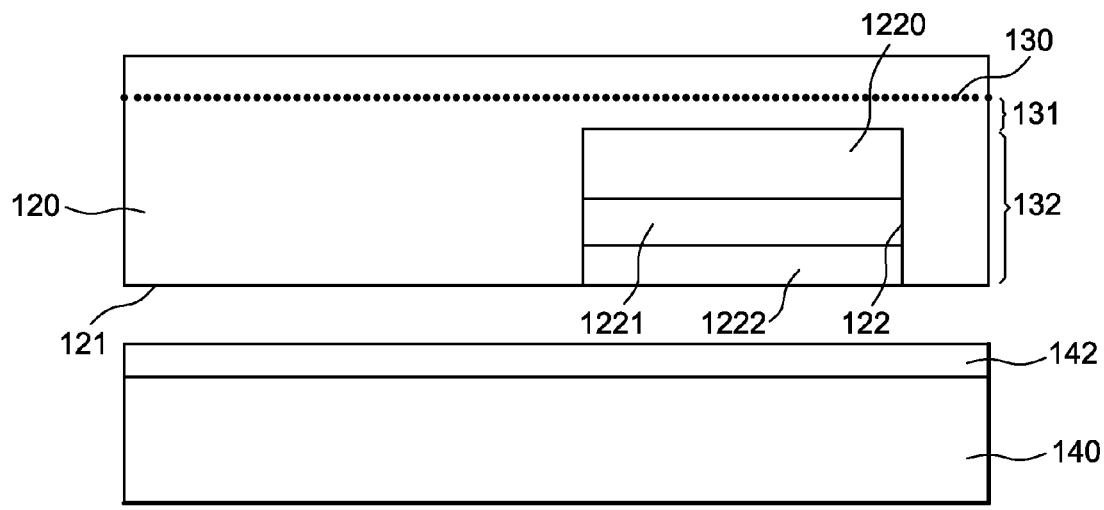

The hybrid layer 120 may then be assembled with a substrate 140, for example covered with a dielectric layer 142 such as a layer of oxide (case of FIG. 6B). This hybrid layer 120 is assembled by the face 121 in which the openings of trenches 122 are made; if the epitaxied layer 1222 is flush with the surface 121, then this epitaxied layer is assembled with the substrate 140, either directly, or via an insulator layer 142, itself formed on this substrate 140 and/or on the hybrid layer 120.

Figure 6C:
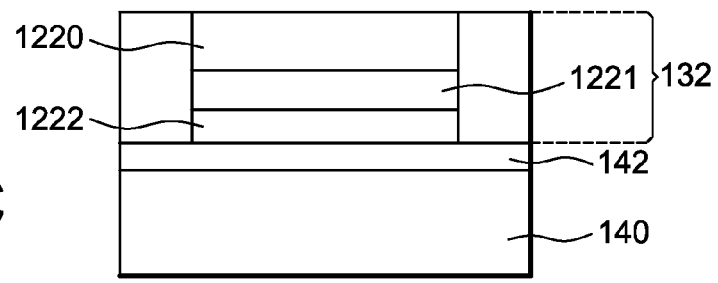

These steps enable a structure as illustrated in FIG. 6C to be obtained. In this figure, the part 131 of the substrate 120 other than the hybrid layer 132 has been eliminated, for example by polishing. But it is possible to leave this part 131.

Once again, an intermediate or buffer substrate 70, 72 (as in FIG. 3B or 4A), may be used, thereby enabling assembly with the substrate 140 or its insulator layer 142, a surface of the substrate 120 other than the surface 121.

Various alternatives of this embodiment may be implemented: for instance, it is possible to position an implantation plane 130 in the hybrid layer 132. Finally, several steps of implantation in the hybrid layer may be carried out, as in the case of example 4 above and with the same advantages.

It is also possible, starting from the structure of FIG. 6B, to eliminate certain of the layers or materials deposited by epitaxy, the layers 1221 and 1220 in this example.

This alternative makes it possible to render the first material 120, which is for example of germanium Ge, compatible, by techniques of non semi-conducting adaptation layers 1220-1221, with a view to an epitaxy of the second material 1222. The adaptation layers 1220-1221 may be selectively removed at a later stage, by elimination of the portion of the layer 131 situated above the cavity 122. Without this compatibility, the second material 1222 cannot be epitaxied in this structure, directly on the material of the substrate 120. This phase (epitaxy, transfer, removal) may be considered as a preliminary step to produce epitaxy seeds of the second material 1222 in the hybrid layer. This elimination takes place for example through selective chemistries, and/or by polishing, and/or by plasma attack, and/or by thermal treatment.

Figure 6D:
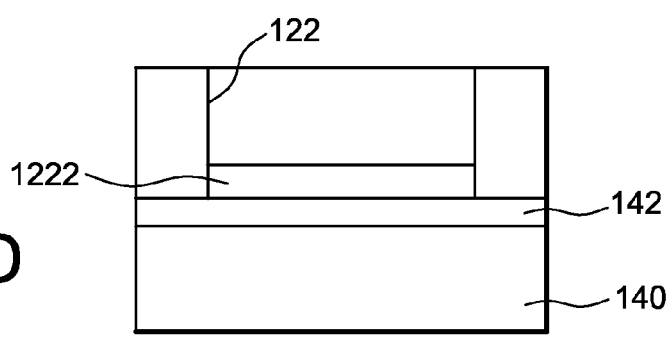

It is the example of FIG. 6D, in which the layers of GaAs 1220 then of InGaAs 1221 have been etched, from the structure of FIG. 6C, leaving uncovered the layer of InGaAsP 1222 in the trench 122. This etching has therefore taken place after the transfer of the hybrid layer.

These alternatives may be of interest to produce quantum wells with multilayer epitaxies that are conserved up to the end, or even to produce a mixed hybrid film, such as for example Ge/InGaAsP resuming if appropriate (or not) at a later stage the epitaxy of InGaAsP.

Figure 7A:
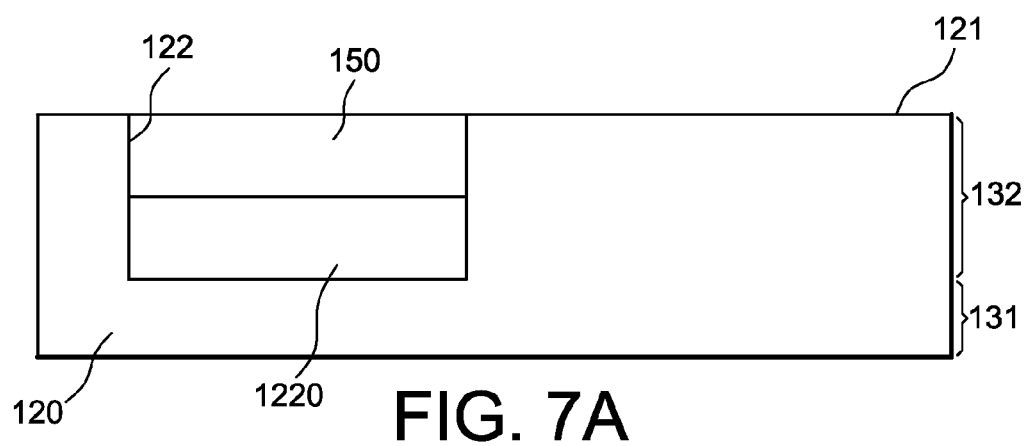
FIGS. 7A-7B represent steps of a specific case of the sixth method according to the invention.
Figure 7B:
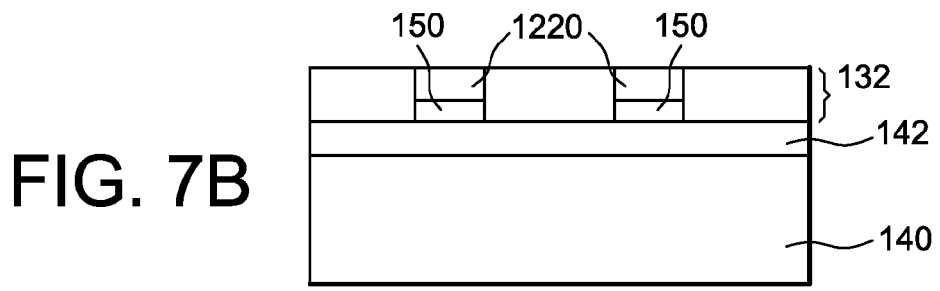

In another approach, an epitaxy of a material 1220 in the cavities 122, 124 may be stopped before having reached the surface 121 of the substrate 120 (FIG. 7A). The difference in topography may be made up for by depositions (for example a thick oxide 150) and one or several thinnings enabling the planeness to be recovered. The thinning of the film 150 is such that directly in line with the zones in a first material 120 there is again, or not, presence of the film 150. Once again, a hybrid layer is obtained, with alternation of zones in material of the substrate and stack zones 1220, 150. This hybrid layer may be assembled with a substrate 140, via a layer 142 for example of oxide (as in FIG. 6B), to obtain a structure as illustrated in FIG. 7B. In this figure, the part 131 of the substrate 120 other than the hybrid layer 132 has been eliminated. In the stack zones, and for this example, an excess thickness of oxide 142, 150 has been created.

According to another alternative, after the epitaxy of the second material, the surface may be higher and the excessive thickness 150 is directly in line with the first material.

According to one specific embodiment of the invention, the aim is to produce a hybrid layer with Si. To do this, the method is identical to that of FIG. 1A and following figures, but a structure layer 22 in Ge/layer 26 in Si or layer 22 in Ge/layer 24 in SiO2/layer 26 in Si is initially used. Then an epitaxy of Ge, or III-V semi-conductor material, in the trenches 28,30 enables, from the substrate 22, mixed caissons and therefore a hybrid layer 26' to be produced.

According to one alternative, a stack of layers is formed in the trenches 28, 30 of the structure of FIG. 1A, as in the case of FIG. 6A. Once again, a structure such as that of FIG. 1C is thereby obtained, but this time it is a stack of layers that is formed in the trenches 28, 30. This embodiment is illustrated in FIG. 1E.

This hybrid layer is at a later stage transferred onto another substrate, for example by applying one or the other of the techniques described above within the scope of examples 1 to 4.

In this embodiment, the initial structure is therefore the same as in FIG. 1A, the layer 22 being in Ge, the layer 26 in Si, with or without layer 24.

Moreover, within the scope of this particular embodiment, the steps of the method described above in liaison with FIGS. 6A-7B may be employed, with all of the transfer alternatives described in FIGS. 1A to 4B. In particular, it is possible, after transfer on a substrate such as the substrate 140, to eliminate certain layers obtained by epitaxy, to produce a structure such as that of FIGS. 6D-7B. In other words, the steps described above in liaison with these FIGS. 6A-7B may be applied to an initial substrate 120, which is not a layer of single material, but a structure such as the stack 20 of FIG. 1A.

Whatever the embodiment envisaged, the substrate 120 may also be a substrate in "6° off" disorientated Si, in which an epitaxy of Ge and/or III-V type semi-conductor materials may be carried out.

FIGS. 8A-9B enable the differences in producing hybrid structures to be illustrated when the implantation is carried out in a substrate 22, provided with an intermediate layer such as the layer 24, and when it is carried out in a substrate not provided with such a layer.

Figure 8A:
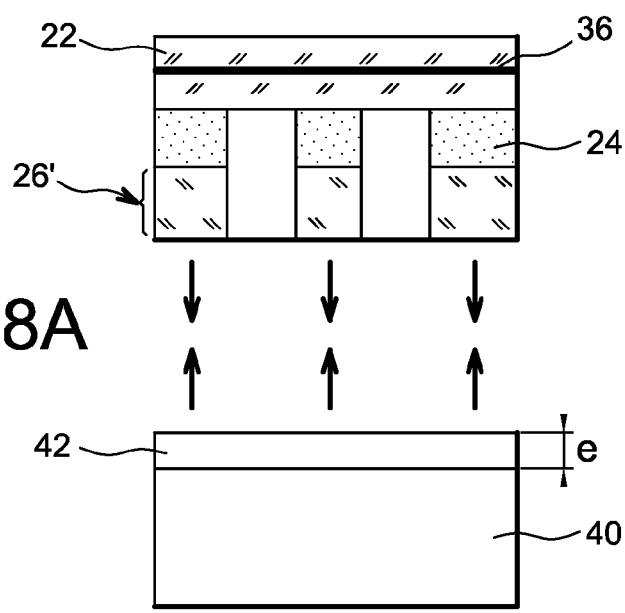
FIGS. 8A-9B represent steps of assembly, then of thinning, in the case of a substrate comprising an intermediate layer (FIGS. 8A, 8B) and in the case of a substrate not comprising such an intermediate layer (FIGS. 9A, 9B)
Figure 8B:
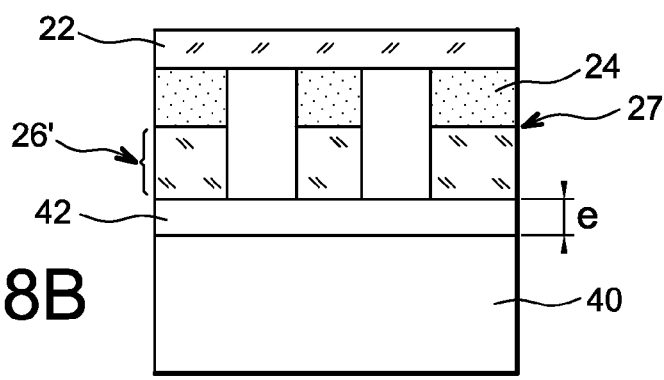

In the first case (FIG. 8A), the layer 24 has been kept. FIG. 8A represents a situation similar to that of FIG. 1F, but in which the embrittlement zone has been made in the substrate 22. After assembly with the substrate 40, or with a layer 42 formed on said substrate (FIG. 8B), and after fracture along the plane 36, the carrying out of a thinning up to the interface layer 24-layer 26' (interface identified also by the arrow 27) may prove to be difficult due to the difference in nature of the materials constituting the mixed layer 24. However, it is this thinning that will enable the hybrid layer 26' to be revealed.

Figure 9A:
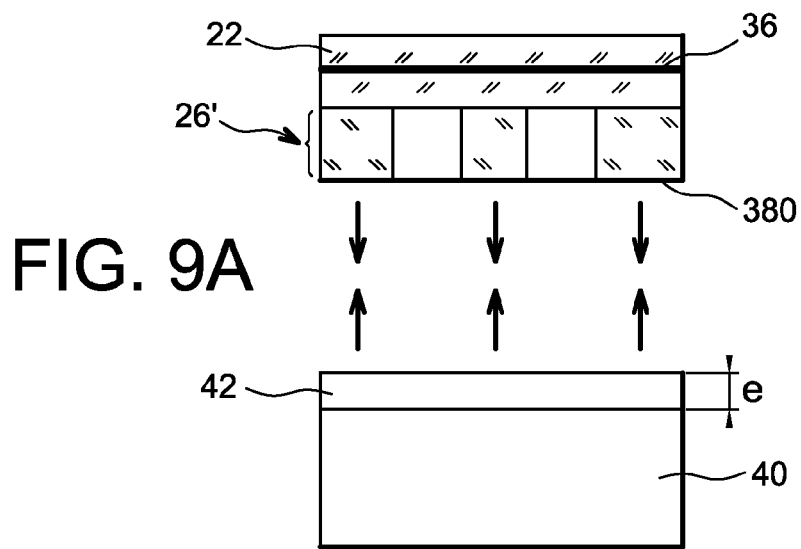
Figure 9B:
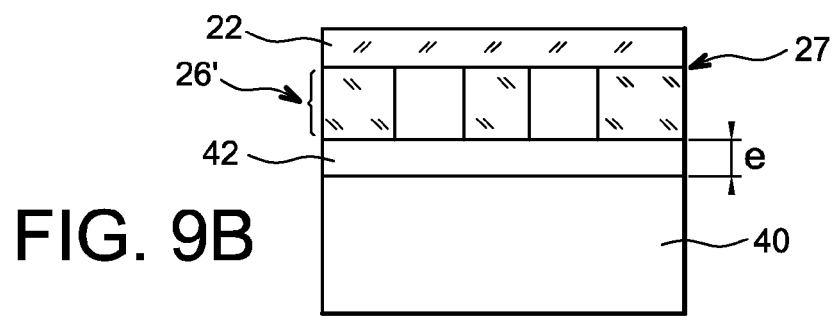
Figure 10:
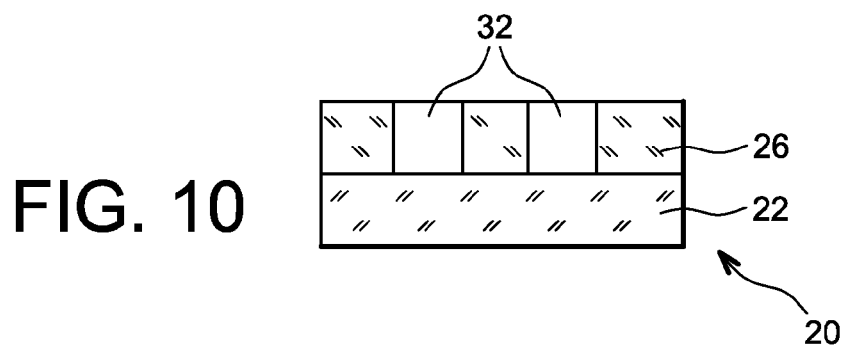

In order to resolve this difficulty if, as in the case of FIG. 9A, which represents a similar initial situation, once again, to that of FIG. 1F, the layer 24 is not initially present, the zone to be thinned is, after fracture along the plane 36, a homogeneous material 22 (FIG. 9B). The thinning up to the interface 27, once again also revealing the layer 26', is then much simpler.

The invention claimed is:

1. A method for producing a hybrid substrate, including a support substrate, a continuous layer of a buried dielectric and, on the continuous layer, a hybrid layer including alternating zones of a first semi-conductor material and at least one second semi-conductor material, wherein the first semi-conductor material and the at least one second semi-conductor material are different by their nature and/or their crystallographic characteristics, the method comprising:
- forming the hybrid layer comprising alternating zones of the first semi-conductor material and the at least one second semi-conductor material, on or in a homogeneous substrate, the alternating zones being arranged without any insulating material between the first and at least one second semi-conductor materials;
- forming a fracture zone by a first implantation of ions or atoms in said hybrid layer;
- after the forming of the hybrid layer, intermediate assembling a free surface of the hybrid layer, or a dielectric layer formed on the free surface, with a buffer substrate;
- fracturing said hybrid layer along said fracture zone, thereby eliminating the homogenous substrate and a first part of said hybrid layer, leaving a second part of said hybrid layer or of said dielectric layer formed on the free surface, assembled with said buffer substrate; and
- second assembling the hybrid layer, the continuous layer of the buried dielectric, and the support substrate.

2. A method according to claim 1, wherein the at least one second semi-conductor material is obtained by epitaxial growth in cavities formed in a layer on the homogeneous substrate, or formed in the homogeneous substrate.

3. A method according to claim 1, wherein the at least one second semi-conductor material is obtained by local amorphization then recrystallization or by deposition in amorphous form, then recrystallization thermal treatment.

4. A method according to claim 1, further comprising thinning the second part of the hybrid layer assembled with the buffer substrate.

5. A method according to claim 4, wherein the thinning of the second part of the hybrid layer is achieved by fracture along a second fracture plane created by a second implantation of ions or atoms.

6. A method according to claim 1, wherein:
the first and at least one second semi-conductor materials are both crystalline and have crystalline orientations of different directions;
or the first semi-conductor material is germanium and the at least one second semi-conductor material is a III-V or III-VI semi-conductor material;
or the first semi-conductor material is silicon and the at least one second semi-conductor material is a III-V semi-conductor material,
or the first material is germanium and the at least one second semi-conductor material is silicon.

7. A method according to claim 1, wherein the hybrid layer comprises alternating zones of a first semi-conductor material and a plurality of second semi-conductor materials.

8. A method according to claim 1, wherein the hybrid layer comprises alternating zones of a first semi-conductor material and a plurality of second materials, the plurality of second materials comprising a plurality of layers of semi-conductor and non semi-conductor materials.

9. A method according to claim 8, wherein at least one of the plurality of layers of materials is obtained by epitaxy.

10. A hybrid layer device, comprising:
a support substrate;
a continuous layer of buried insulator and, on the continuous layer, a hybrid layer comprising alternating zones of a first material and at least one second material, the first material and the at least one second material being different by their nature and/or their crystallographic characteristics, at least two zones of the at least one second material having different depth or different height.

11. A device according to claim 10, wherein the first material and the at least one second material are semi-conductor materials.

12. A device according to claim 11, wherein:
the first material and the at least one second material are both of silicon, and have crystalline orientations of different directions;
or the first material is germanium and the at least one second material is a II-V or II-VI or III-V semi-conductor material;
or the first material is germanium and the at least one second material is silicon;
or the hybrid layer comprises alternating zones of a first semi-conductor material and a plurality of second semi-conductor and/or non semi-conductors materials.

13. A device according to claim 12, wherein the plurality of second semi-conductor materials comprise a plurality of layers of semi-conductor materials, or a plurality of layers of semi-conductor and non semi-conductor materials.

14. A device according to claim 11, wherein the zones in the at least one second material are formed flush with a surface of the device, or the zones in the at least one second material are formed up to a level situated underneath the surface of the device.

15. A device according to claim 14, wherein the zones in the at least one second material are formed up to a level situated underneath the surface of the device and an insulating material is arranged to make up for a difference between the level of the at least one second material and the surface of the device.

16. A method for producing a hybrid substrate, including a support substrate, a continuous layer of a buried dielectric and, on the continuous layer, a hybrid layer including alternating zones of a first semi-conductor material and at least one second semi-conductor material, wherein the first semi-conductor material and the at least one second semi-conductor material are different by their nature and/or their crystallographic characteristics, the method comprising:
- forming the hybrid layer, comprising alternating zones of the first semi-conductor material and the at least one second semi-conductor material, on or in a homogeneous substrate, the alternating zones being arranged without any insulating material between the first and at least one second semi-conductor materials;
- assembling the hybrid layer, the continuous layer of the buried dielectric and the support substrate; and
- eliminating the homogeneous substrate and a first part of said hybrid layer, leaving a second part of said hybrid layer or a dielectric layer formed on a surface of the hybrid layer, assembled with said support substrate.

17. A method according to claim 16, wherein the eliminating of the homogeneous substrate and the first part of the hybrid layer, is obtained by thinning, said thinning being achieved by fracture, of the hybrid layer along a first fracture plane created by a first implantation of ions or of atoms in the hybrid layer, or by mechanical thinning of the homogeneous substrate and of the hybrid layer.

18. A method according to claim 17, wherein the thinning is achieved by the fracture along the first fracture plane.

19. A method according to claim 16, wherein the at least one second material is obtained:
by epitaxial growth in cavities formed in a layer on the homogeneous substrate, or formed in the homogeneous substrate;

or by local amorphisation, and then recrystallisation, or by deposition in amorphous form, and then recrystallisation thermal treatment.

20. A method according to claim 16, wherein:
the first and at least one second semi-conductor materials are both crystalline and have crystalline orientations of different directions;
or the first semi-conductor material is germanium and the at least one second semi-conductor material is a III-V or III-VI semi-conductor material;
or the first semi-conductor material is silicon and the at least one second semi-conductor material is a III-V semi-conductor material,
or the first semi-conductor material is germanium and the at least one second semi-conductor material is silicon.

21. A method according to claim 16, wherein the hybrid layer comprises alternating zones of a first semi-conductor material and a plurality of second semi-conductor materials.

22. A method according to claim 16, wherein the hybrid layer comprises alternating zones of a first semi-conductor material and a plurality of second materials, the plurality of second materials comprising a plurality of layers of semi-conductor and non semi-conductor materials.

23. A method according to claim 22, wherein at least one layer of the plurality of layers of materials is obtained by epitaxy.

24. A method for producing a hybrid substrate, including a support substrate, a continuous layer of a buried dielectric and, on the continuous layer, a hybrid layer including alternating zones of a first material and at least one second material, wherein the first material and the at least one second material are different by their nature and/or their crystallographic characteristics, the method comprising:
forming the hybrid layer, comprising alternating zones of the first material and the at least one second material, in a homogeneous substrate,
assembling the hybrid layer, the continuous dielectric layer and the support substrate, and
eliminating a part of the homogeneous substrate.

25. A method according to claim 24, further comprising eliminating a first part of said hybrid layer, leaving a second part of said hybrid layer or of a dielectric layer formed on surface of the second part of said hybrid layer, assembled with said support substrate.

26. A method according to claim 24, wherein the eliminating the part of the homogeneous substrate and, if appropriate, a part of the hybrid layer, is obtained by thinning, respectively of the substrate and, if appropriate, of the hybrid layer.

27. A method according to claim 26, wherein the thinning is achieved by fracture, respectively of the homogeneous substrate or, if appropriate, of the hybrid layer along a fracture plane created by an implantation of ions or of atoms in the homogeneous substrate or in the hybrid layer, or by mechanical thinning of the substrate and if appropriate the hybrid layer.

* * * * *